United States Patent
Patra (10) Patent No.: US 10,928,733 B2
(45) Date of Patent: Feb. 23, 2021

(54) ILLUMINATION OPTIC FOR PROJECTION LITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/934,652

(22) Filed: Jul. 21, 2020

(65) Prior Publication Data

US 2020/0348600 A1 Nov. 5, 2020

Related U.S. Application Data (63) Continuation of application No. PCT/EP2019/050059, filed on Jan. 3, 2019.

(30) Foreign Application Priority Data

Jan. 31, 2018 (DE) ................ 10 2018 201 457.4

(51) Int. Cl.
  *G03F 7/20* (2006.01)
(52) U.S. Cl.
  CPC .......... *G03F 7/70075* (2013.01); *G03F 7/702* (2013.01); *G03F 7/70033* (2013.01); *G03F 7/70233* (2013.01)
(58) Field of Classification Search
  CPC .............. G03F 7/7015; G03F 7/70191; G03F 7/70566; G03F 7/70091; G03F 7/70075
  (Continued)

(56) References Cited

U.S. PATENT DOCUMENTS

| 6,438,199 B1 | 8/2002 | Schultz et al. |
| 6,507,440 B1 | 1/2003 | Schultz et al. |

(Continued)

FOREIGN PATENT DOCUMENTS

| DE | 199 31 848 A1 | 1/2001 |
| DE | 10 2006 017 336 A1 | 10/2007 |

(Continued)

OTHER PUBLICATIONS

U.S. Pat. No. 6,507,440 B1 is a US counterpart of DE 199 31 848 A1.

(Continued)

*Primary Examiner* — Hung Nguyen
(74) *Attorney, Agent, or Firm* — Fish & Richardson P.C.

(57) ABSTRACT

An illumination optical unit for projection lithography illuminates an object field with illumination light along an illumination beam path. The arrangement of field facets of a field facet mirror and also of pupil facets of a pupil facet mirror is such that an illumination channel is guided over each of them. The field facet mirror images a light source image along in each case one illumination channel onto one of the pupil facets. The pupil facet mirror superimposedly images the field facets into the object field. The illumination optical unit is designed for the settable specification of a spatial resolution of an illumination light illumination of an entrance pupil of a projection optical unit arranged downstream of the object field in the illumination light beam path. The result of this is an illumination optical unit with which illumination light can be used efficiently for high-contrast imaging of the structures to be projected.

20 Claims, 8 Drawing Sheets

(58) Field of Classification Search
USPC .................................................. 355/53, 67
See application file for complete search history.

(56) References Cited

U.S. PATENT DOCUMENTS

| | | | |
|---|---|---|---|
| 6,658,084 B2 | 12/2003 | Singer | |
| 6,859,328 B2 | 2/2005 | Schultz et al. | |
| 7,626,770 B2 | 12/2009 | Singer et al. | |
| 8,817,233 B2 | 8/2014 | Mann | |
| 9,891,530 B2 | 2/2018 | Endres et al. | |
| 10,216,091 B2 | 2/2019 | Deguenther et al. | |
| 10,408,765 B2 | 9/2019 | Mann | |
| 2003/0043455 A1 | 3/2003 | Singer et al. | |
| 2007/0236784 A1 | 10/2007 | Singer et al. | |
| 2011/0001947 A1 | 1/2011 | Dinger et al. | |
| 2012/0287414 A1 | 11/2012 | Fiolka et al. | |
| 2015/0055110 A1* | 2/2015 | Maul | G03F 7/70191 355/67 |
| 2017/0176865 A1* | 6/2017 | Deguenther | G03F 7/70033 |

FOREIGN PATENT DOCUMENTS

| | | |
|---|---|---|
| DE | 10 2009 025 656 A1 | 4/2010 |
| DE | 10 2010 001 388 A1 | 8/2011 |
| DE | 10 2011 004 615 A1 | 9/2011 |
| DE | 10 2011 076 145 A1 | 11/2012 |
| DE | 10 2013 206 981 A1 | 12/2013 |
| DE | 10 2012 212 453 A1 | 1/2014 |
| DE | 10 2013 204 445 A1 | 9/2014 |
| DE | 10 2014 216 801 A1 | 2/2016 |
| EP | 1 225 481 A | 7/2002 |
| WO | WO 2008/149178 A1 | 12/2008 |
| WO | WO 2009/100856 A1 | 8/2009 |
| WO | WO 2009/132756 A1 | 11/2009 |

OTHER PUBLICATIONS

U.S. Pat. No. 7,626,770 B2 is a US counterpart of DE 10 2006 017 336 A1.
U.S. Pat. No. 8,817,233 B2 is a US counterpart of DE 10 2011 004 615 A1.
U.S. Pat. No. 9,891,530 B2 is a US counterpart of DE 10 2012 212 453 A1.
U.S. Pat. No. 10/408,765 B2 is a US counterpart of DE 10 2013 204 445 A1.
U.S. Pat. No. 10/216,091 B2 is a US counterpart of DE 10 2014 216 801 A1.
US Publication 2003/0043455 is a US counterpart of EP 1225481A2.
US Publication 2012/0287414 is a US counterpart of DE 10 2010 001 388 A1.
German Examination Report, with translation thereof, for corresponding Appl No. DE 10 2018 201 457.4, dated Oct. 11, 2018.
Translation of International search report corresponding PCT Appl No. PCT/EP2019/050059, dated Apr. 11, 2019.

* cited by examiner

ILLUMINATION OPTIC FOR PROJECTION LITHOGRAPHY

CROSS-REFERENCE TO RELATED APPLICATIONS

The present application is a continuation of, and claims benefit under 35 USC 120 to, international application PCT/EP2019/050059, filed Jan. 3, 2019, which claims benefit under 35 USC 119 of German Application No. 10 2018 201 457.4, filed Jan. 31, 2018. The entire disclosure of these applications are incorporated by reference herein.

FIELD

The disclosure relates to an illumination optical unit for projection lithography for illuminating an object field in which an object to be imaged is arrangeable with illumination light from a light source along an illumination light beam path. Furthermore, the disclosure relates to an illumination system and an optical system with such an illumination optical unit, to a projection exposure apparatus with such an optical system, to a method for producing a microstructured or nanostructured component with such a projection exposure apparatus and to a microstructured or nanostructured component produced with such a method.

BACKGROUND

An illumination optical unit for projection lithography is known from US 2007/0236784 A1, DE 10 2012 212 453 A1, DE 10 2009 025 656 A1, US 2011/0001947 A1, WO 2009/132 756 A1, WO 2009/100 856 A1 and from U.S. Pat. No. 6,438,199 B1 and U.S. Pat. No. 6,658,084 B2.

A field facet mirror is known from DE 19 931 848 A1, from WO 2008/149 178 A1, from DE 10 2011 076 145 A1 and from U.S. Pat. No. 6,859,328. DE 10 2013 204 445 A1 discloses a magnifying imaging optical unit and an EUV mask inspection system with such an imaging optical unit.

SUMMARY

The present disclosure seeks to develop an illumination optical unit for lithography so that the illumination light is used efficiently for high-contrast imaging of the structures to be projected.

In a general aspect, the disclosure provides an illumination optical unit for projection lithography for illuminating an object field, in which an object to be imaged is arrangeable, with illumination light from a light source along an illumination beam path. The illumination optical unit includes a field facet mirror with a plurality of field facets, and a pupil facet mirror with a plurality of pupil facets. The arrangement of the field facets and of the pupil facets is such that in each case a partial beam of the illumination light is guided over exactly one field facet and exactly one pupil facet along an illumination channel from the light source to the object field. The field facet mirror is a component of a field facet transfer optical unit for imaging a light source image along in each case one illumination channel onto one of the pupil facets. The pupil facet mirror is a component of a pupil facet transfer optical unit for superimposing imaging of the field facets into the object field. Characterized by an embodiment for settable specification of a spatial resolution of an illumination light illumination of an entrance pupil of a projection optical unit arranged downstream of the object field in the illumination light beam path for imaging the object field into an image field.

According to the disclosure, it has been found that illumination light illumination of the entrance pupil of the projection optical unit arranged downstream of the illuminated object field is dependent on a design of object structures to be imaged, and that the desired spatial resolution of illumination light illumination of an entrance pupil of a projection optical unit arranged downstream of the illuminated object field is therefore also dependent on the design of the object structures to be imaged. According to the disclosure, the spatial resolution of the entrance pupil illumination can be specified in a settable manner and can thus be adapted to the desired properties of the respective object structures. The result is an efficient use of the illumination light, which can be provided with the respectively desired spatial resolution of the entrance pupil illumination. In particular, the illumination light can be cut off where this leads to lower light losses due to less intensive contributions from the illumination light in order to provide a high spatial resolution. A measure of the spatial resolution of the entrance pupil illumination is a degree of pupil filling. A definition of the degree of pupil filling (pupil filling ratio) can be found, for example, in US 2007/0236784 A1. Another measure of the spatial resolution of the entrance pupil illumination is the size of an imaging spot, that is to say of a light source image, of an illuminated pupil facet in the entrance pupil of the projection optical unit, and a number of such imaging spots.

The field facet mirror can be designed to be displaceable relative to the light source image for the settable specification of a distance between the field facets and the light source image. Such a field facet mirror can make it possible to vary the number of illuminated field facets by changing the size of a far field illuminating the field facet mirror. The smaller the number of possible illumination channels that then follows is, the higher the spatial resolution that is achievable with the entrance pupil illumination can as a result be.

The field facets of the field facet mirror can be designed with an optical power that is specifiable in a settable manner. Such field facets can allow an adaptation of the imaging of the light source image onto the pupil facets in particular to a variable distance between the light source image and the respective field facets. The field facets can in particular be those with a radius of curvature that is settable by actuation. Solutions for optical powers that are settable in this way are known, for example, from applications for adaptive mirrors. A person skilled in the art will find examples of field facets with a settable radius of curvature in DE 10 2013 206 981 A1.

In some embodiments, a displacement of the field facet mirror relative to the light source image for the settable specification of the distance between the field facets and the light source image does not lead to a change in the light path along the illumination channels between the light source image and the object field. Such embodiments can enable a settable specification of the distance between the field facets and the light source image, without a relative displacement between the light source image and the object field being necessary. This can simplify the change of the distance between the field facets and the light source image and thus the setting of the spatial resolution of the entrance pupil illumination.

In some embodiments, the field facet mirror is designed to be tiltable over-all, the pupil facet mirror is designed to be tiltable over-all, the pupil facet mirror is designed to be displaceable relative to the light source image for the settable specification of the distance between the field facets and the pupil facets, and at least one additional mirror is present in the illumination light beam path of the illumination optical unit between the light source image and the object field. Such embodiments can enable a distance setting between the field facet mirror and the light source image, in which a relative position between the light source image and the object field remains unchanged. The additional mirror can be designed as a condenser mirror for imaging the pupil facets into an entrance pupil of the downstream projection optical unit. This can be an additional mirror down-stream of the pupil facet mirror in the illumination light beam path.

In some embodiments, the illumination optical unit includes an entrance pupil superposition optical unit arranged down-stream of the pupil facet mirror in the illumination light beam path for imaging the pupil facets into an entrance pupil of a downstream projection optical unit for imaging the object field into an image field, and the entrance pupil transfer optical unit is designed for the settable specification of an imaging scale of the imaging of the pupil facets onto the entrance pupil with the relative position of the pupil facet mirror relative to the object field staying the same. Such embodiments can enable a settable variation of a spatial resolution of an entrance pupil illumination.

In some embodiments, the entrance pupil transfer optical unit includes at least one mirror which is designed displaceably relative to the pupil facet mirror for the settable specification of the imaging scale of the imaging of the pupil facets onto the entrance pupil. Such embodiments can enable a fine imaging scale specification. The entrance pupil transfer optical unit can also have more than one displaceable mirror.

In some embodiments, a mirror of the entrance pupil transfer optical unit is designed with an optical power that is specifiable in a settable manner. Such embodiments can be implemented with exactly one mirror. The specifiable optical power can be realized via a radius of curvature, which is settable by actuation, of the at least one mirror of the entrance pupil transfer optical unit. Techniques known from the field of adaptive optical units can also be used for this.

In some embodiments, the pupil facet mirror is designed for the settable specification of a pupil facet distance of adjacent pupil facets perpendicular to a normal on a reflection surface of the pupil facets. In such embodiments, an increase in the spatial resolution of an entrance pupil illumination is made possible by reducing an illuminated face of the respective pupil facet that effectively contributes to the object field illumination.

The settable distance specification between the neighboring pupil facets can be achieved by tilting the entire pupil facet mirror. Alternatively or additionally, the pupil facets along the pupil facet distance can be arranged to be displaceable relative to one another on a pupil facet carrier of the pupil facet mirror.

The advantages of an illumination system disclosed herein, an optical system disclosed herein, a projection exposure apparatus disclosed herein, a production method as disclosed herein, and of a microstructured or nanostructured component as disclosed herein can correspond to those which have already been explained above with reference to the illumination optical unit according to the disclosure. In the manufacturing process, after checking the object structures to be imaged, a setting of the spatial resolution of the entrance pupil illumination that is adapted thereto can be effected by correspondingly setting the illumination optical unit.

The component can be produced with an extremely high structural resolution. In this way it is possible, for example, to produce a semiconductor chip having an extremely high integration or storage density.

BRIEF DESCRIPTION OF THE DRAWINGS

Exemplary embodiments of the disclosure are explained in greater detail below with reference to the drawings, in which.

EXEMPLARY EMBODIMENTS OF THE DISCLOSURE

Figure 1:
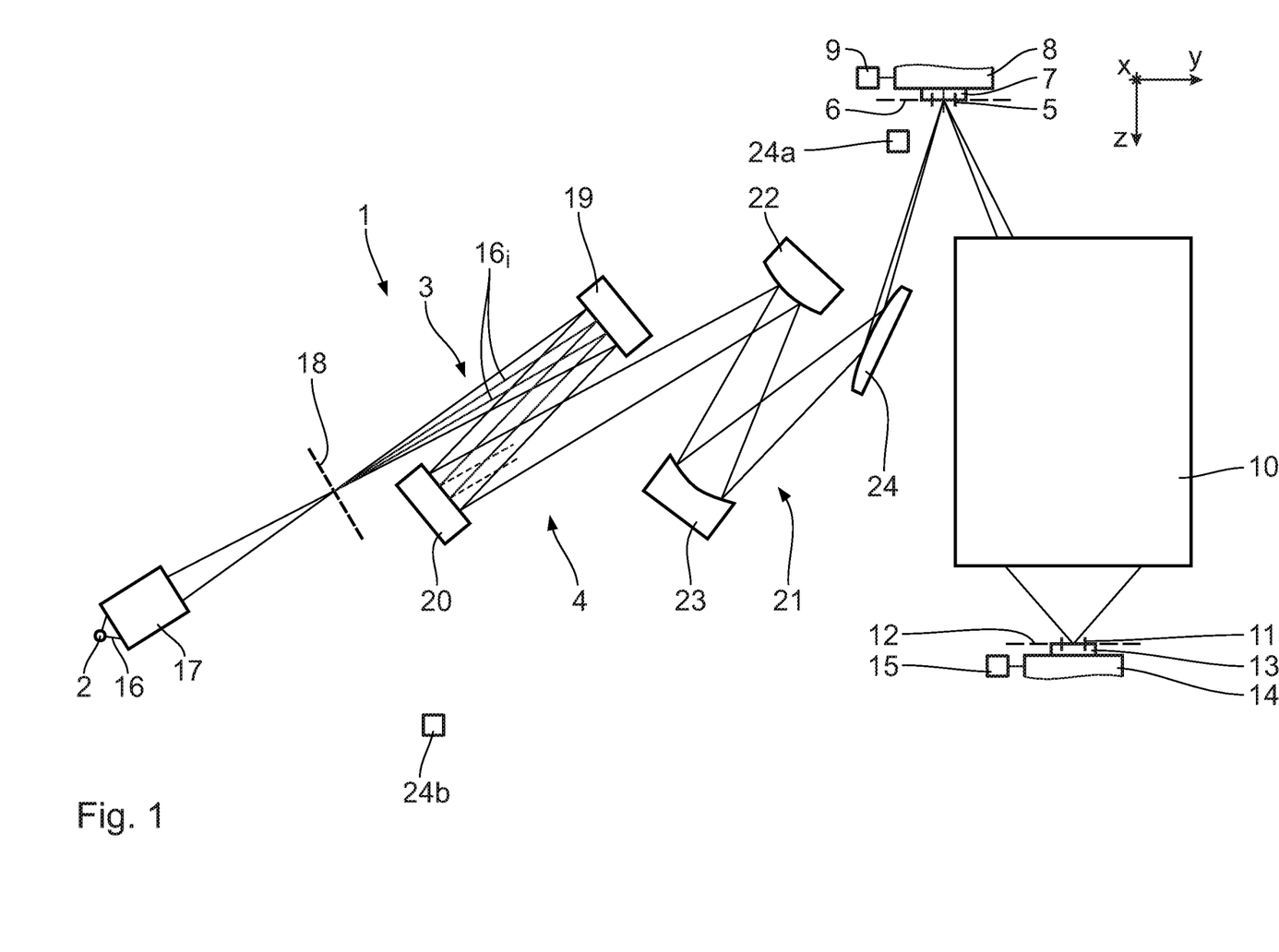
FIG. 1 schematically shows a meridional section through a projection exposure apparatus for EUV projection lithography with an illumination optical unit for an object field and an imaging optical unit for imaging the object field into an image field.

FIG. 1 schematically shows a microlithographic projection exposure apparatus 1 in a meridional section. The projection exposure apparatus 1 includes a light or radiation source 2. An illumination system 3 of the projection exposure apparatus 1 has an illumination optical unit 4 for exposing an illumination field coinciding with an object field 5 in an object plane 6. The illumination field may also be larger than the object field 5. In this case, an object in the form of a reticle 7 arranged in the object field 5, the reticle being held by an object or reticle holder 8, is exposed. The reticle 7 is also referred to as lithography mask. The object holder 8 is displaceable along an object displacement direction by means of an object displacement drive 9. A highly schematically illustrated projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable parallel to the object displacement direction in a manner synchronized with the object holder 8 using a wafer displacement drive 15.

The radiation source 2 is an EUV radiation source having an emitted used radiation in the range of between 5 nm and 30 nm. This may be a plasma source, for example a GDPP (gas discharge-produced plasma) source or an LPP (laser-produced plasma) source. A radiation source based on a synchrotron or on a free electron laser (FEL) may also be used for the radiation source 2. Information about such a radiation source is able to be found by the person skilled in the art for example from U.S. Pat. No. 6,859,515 B2. EUV radiation 16 which emanates from the radiation source 2, in particular the used illumination and imaging light that illuminates the object field 5, is focused by a collector 17. A corresponding collector is known from EP 1 225 481 A.

Downstream of the collector 17, the EUV radiation 16 propagates through an intermediate focal plane 18 before being incident on a field facet mirror 19. An intermediate focus 18a of the illumination light 16 is present in the intermediate focal plane 18. The intermediate focus 18a represents an image of the light source 2.

The field facet mirror 19 is a first facet mirror of the illumination optical unit 4. The field facet mirror 19 includes a plurality of reflective field facets, which are not depicted in FIG. 1. The field facet mirror 19 is arranged in a field plane of the illumination optical unit 4 that is optically conjugate with respect to the object plane 6.

The EUV radiation 16 is also referred to hereinafter as illumination light or as imaging light.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate with respect to the intermediate focal plane 18 and with respect to a pupil plane of the projection optical unit 10 or coincides with the pupil plane. The pupil facet mirror 20 has a plurality of reflective pupil facets, which are not depicted in FIG. 1.

The field facets of the field facet mirror 19 are imaged into the object field 5 superposed on one another with the aid of the pupil facets of the pupil facet mirror 20 and an imaging optical assembly downstream thereof in the form of a transfer optical unit 21 with mirrors 22, 23 and 24, denoted by the order in the beam path. The last mirror 24 of the transfer optical unit 21 is a grazing incidence mirror. Depending on the design of the illumination optical unit 4, the transfer optical unit 21 can also be dispensed with entirely or partially.

The arrangement of the field facets and of the pupil facets is such that in each case a partial beam of the illumination light 16 is guided over exactly one of the field facets and over exactly one of the pupil facets along an illumination channel from the light source 2 to the object field 5. The field facet mirror 19 is in this case a component of a field facet transfer optical unit for imaging a light source image along in each case one of the illumination channels onto one of the pupil facets. The pupil facet mirror is in this case a component of a pupil facet transfer optical unit for superimposing imaging of the field facets into the object field 5.

Illumination light 16, which is guided, for example, in the object plane 6 to larger absolute x values than the x dimension of the object field 5, can be guided to a plurality of energy or dose sensors, of which FIG. 1 schematically shows a dose sensor 24a, with the aid of a corresponding optical unit (not shown). The dose sensor 24a is connected to a central control device 24b, in a manner not shown, for signal transmission. The dose sensor 24a generates an input signal for controlling the light source 2 and/or the object displacement drive 9 and/or the wafer displacement drive 15. In this way, a dose adjustment of an exposure of the wafer 13 in the image field 11 can be achieved by adapting the power of the light source 2 and/or by adapting the scanning speed. Both an illumination intensity distribution over the object field 5 and an illumination angle distribution, with which the object field points of the object field 5 are individually illuminated, can be measured using sensors corresponding to the dose sensor 24a. Using appropriate sensors, which can be arranged in the illumination or imaging beam path of the illumination light 16 in the region of a field plane and/or in the region of a pupil plane, both an intensity distribution over the object field 5 and a field-point-dependent intensity distribution over a pupil plane of the projection exposure apparatus 1 can be achieved, in particular via the entrance pupil of the projection optical unit 10.

The control device 24b is, among other things, connected for signal transmission to tilt actuators for the field facets 25 of the field facet mirror 19 and to further displacement actuators for components of the various designs of the illumination optical unit that are described below and are displaceable in a settable manner.

In order to simplify the description of positional relationships, FIG. 1 plots a Cartesian xyz-coordinate system as a global coordinate system for the description of the positional relationships of components of the projection exposure apparatus 1 between the object plane 6 and the image plane 12. In FIG. 1, the x-axis extends perpendicularly to the plane of the drawing into the latter. In FIG. 1, the y-axis extends to the right and parallel to the displacement direction of the object holder 8 and of the wafer holder 14. In FIG. 1, the z-axis extends downward, i.e. perpendicular to the object plane 6 and to the image plane 12.

The x-dimension over the object field 5 or the image field 11 is also referred to as the field height. The object displacement direction extends parallel to the y-axis.

Local Cartesian xyz-coordinate systems are plotted in the further figures. The x-axes of the local coordinate systems extend parallel to the x-axis of the global coordinate system according to FIG. 1. The xy-planes of the local coordinate systems represent arrangement planes of the components respectively presented in the figure. The y- and z-axes of the local coordinate systems are accordingly tilted through a certain angle about the respective x-axis.

Figure 2:
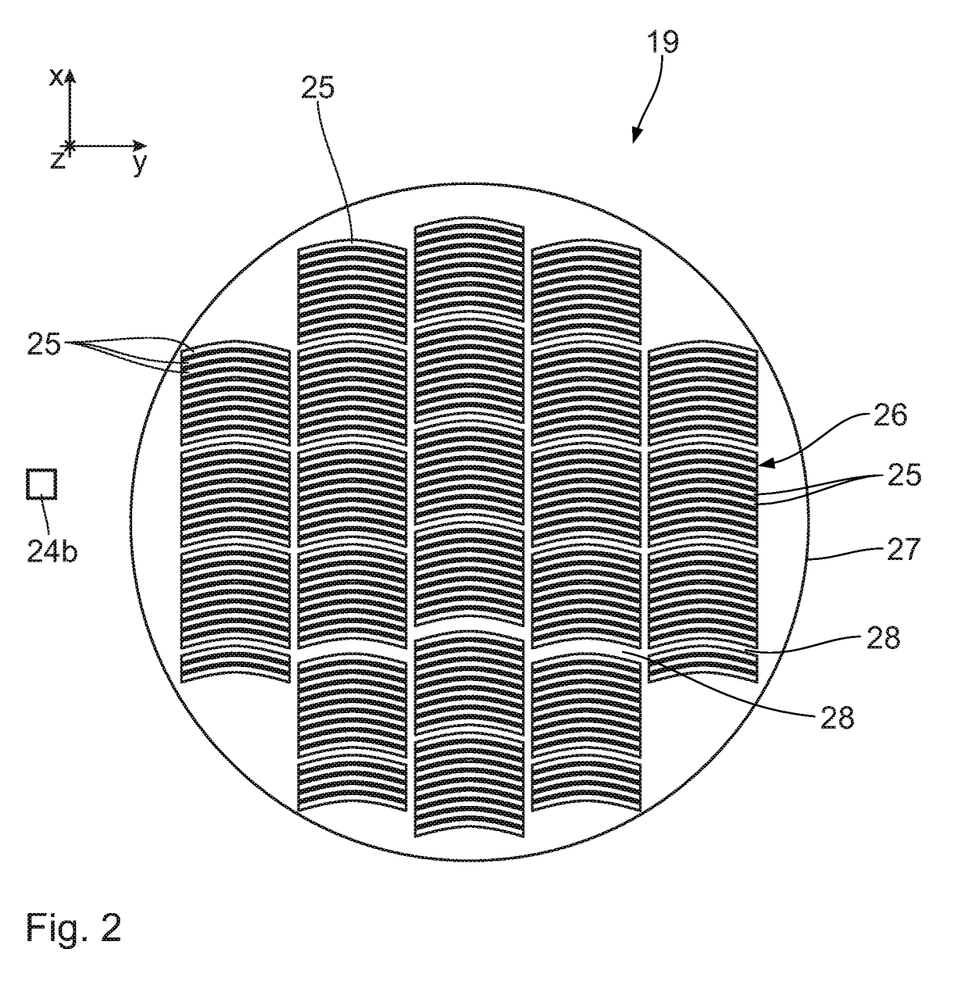
FIGS. 2 and 3 show arrangement variants of field facet mirrors which may be embodied with monolithic field facets but may also have field facets which are constructed from a plurality of individual mirrors in each case.
Figure 3:
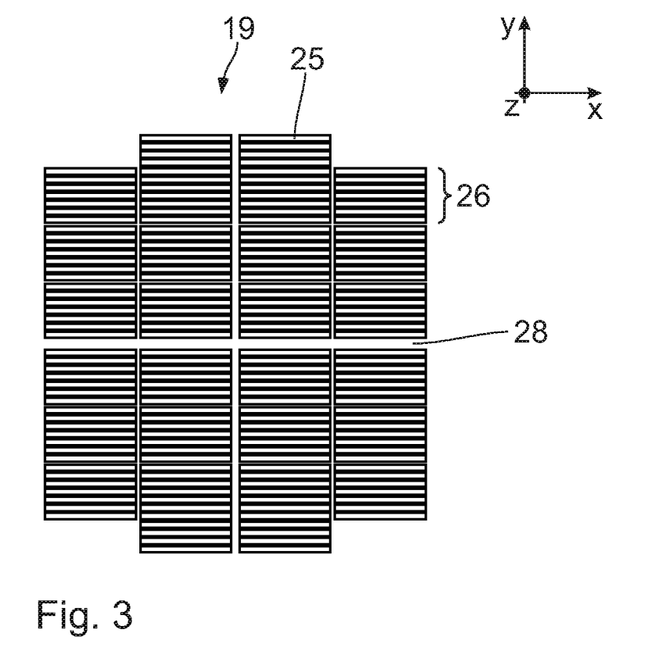

FIGS. 2 and 3 show examples of different facet arrangements for the field facet mirror 19. Each of the field facets 25 presented therein can be constructed as an individual-mirror group from a plurality of individual mirrors, as is known from e.g. WO 2009/100 856 A1. In each case one of the individual-mirror groups then has the function of a facet of a field facet mirror such as is disclosed for example in U.S. Pat. No. 6,438,199 B1 or U.S. Pat. No. 6,658,084 B2.

The field facets 25 can be designed so they are tiltable between a plurality of tilt positions by way of an actuator.

The field facet mirror 19 according to FIG. 2 includes a multiplicity of field facets 25 with an arcuate design. These are arranged, in groups, in field facet blocks 26 on a field facet carrier 27. Overall, the field facet mirror 19 according to FIG. 2 includes twenty-six field facet blocks 26, in which three, five or ten of the field facets 25 are combined in groups. Intermediate spaces 28 are present between the field facet blocks 26.

The field facet mirror 19 according to FIG. 3 includes rectangular field facets 25, which, once again, are arranged in groups to form field facet blocks 26, between which intermediate spaces 28 are present.

Figure 4:
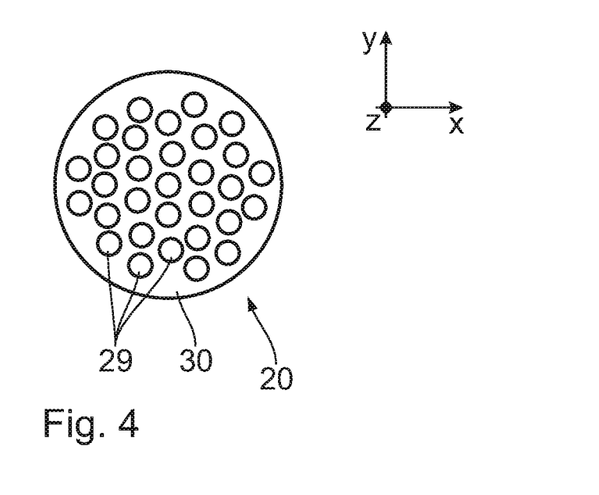
FIG. 4 schematically shows a plan view of a pupil facet mirror which, together with the field facet mirror, is part of an illumination optical unit of the projection exposure apparatus, wherein it is also the case here that the pupil facet mirror can have monolithic pupil facets, but can also have pupil facets that are each constructed from a plurality of individual mirrors.

FIG. 4 schematically shows a plan view of the pupil facet mirror 20. Pupil facets 29 of the pupil facet mirror 20 are arranged in the region of an illumination pupil of the illumination optical unit 4. In reality, the number of the pupil facets 29 is much greater than is presented in FIG. 4. In reality, the number of the pupil facets 29 can be greater than the number of the field facets 25 and can be a multiple of the number of the field facets 25. The pupil facets 29 are arranged on a pupil facet carrier 30 of the pupil facet mirror 20. A distribution of pupil facets 29, which are impinged upon by the illumination light 16 via the field facets 25, within the illumination pupil prescribes an actual illumination angle distribution in the object field 5.

Each of the field facets 25 serves to transfer a part of the illumination light 16, i.e. an illumination light partial beam $16_i$, from the light source 2 toward one of the pupil facets 29.

Below, in a description of the illumination light partial beams $16_i$, the assumption is made that the associated field facet 25 is in each case illuminated to the maximum extent, i.e. over its entire reflection surface. In this case, a peripheral contour of the illumination light partial beam $16_i$ coincides with a peripheral contour of the illumination channel, which is why the illumination channels are also denoted by $16_i$ below. The respective illumination channel $16_i$ represents one possible light path of an illumination light partial beam $16_i$ illuminating the associated field facet 25 to the maximum extent, via the further components of the illumination optical unit 4.

For each of the illumination channels $16_i$, the transfer optical unit 21 respectively includes one of the pupil facets 29 for transferring the illumination light partial beam $16_i$ from the field facet 25 toward the object field 5.

In each case one illumination light partial beam $16_i$, of which two illumination light partial beams $16_i$ (i=1, ..., N; N: number of the field facets) are shown schematically in FIG. 1, is guided between the light source 2 and the object field 5 over exactly one of the field facets 25 and over exactly one of the pupil facets 29, in each case via an illumination channel.

The illumination optical unit 4 of the projection exposure apparatus 1 is configured for the settable specification of a spatial resolution for illuminating an entrance pupil 31 of the projection optical unit 10 with the illumination light 16. A variant of this embodiment is explained below with reference to FIGS. 5 to 10. Components and functions corresponding to those which have already been explained above with reference to FIGS. 1 to 4 bear the same reference signs and will not be discussed in detail again.

Figure 5:
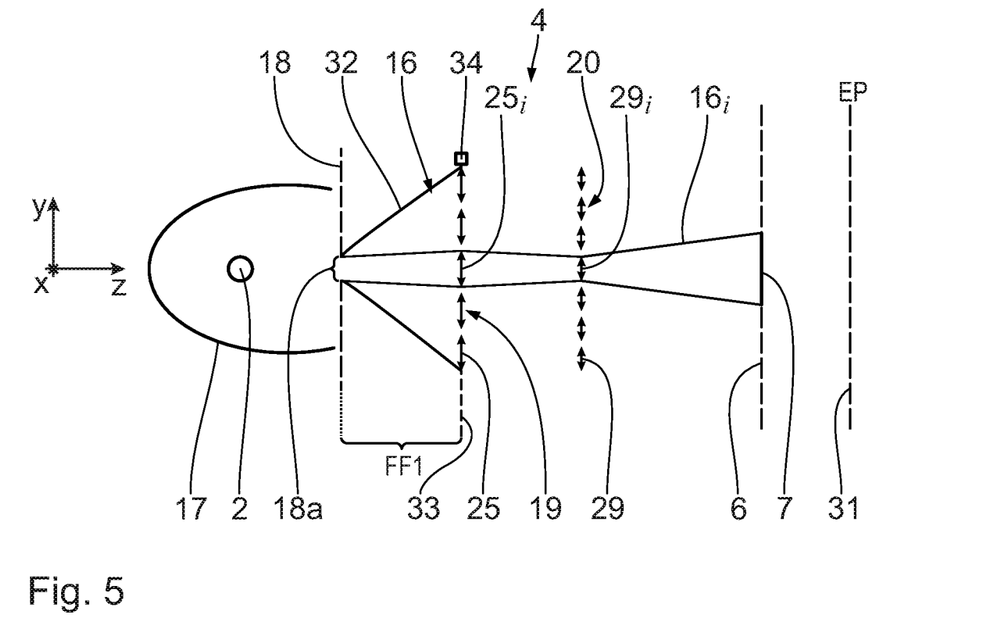
FIG. 5 shows highly schematically and for illustration in transmission an embodiment of the illumination optical unit with a first, greater distance between an intermediate focus of the illumination light and the field facet mirror.

FIG. 5 schematically shows components of the illumination optical unit 4 starting from the light source 2 to the object field 5, wherein, in contrast to the illumination optical unit according to FIG. 1, no transfer optical unit 21 is present.

Downstream of the intermediate focus 18a, the beam path of an illumination channel $16_i$ between the intermediate focus 18a and the object field 5 is shown. Downstream of the intermediate focus 18a, an envelope 32 of the entire illumination of a far field is also shown in the region of an arrangement plane 33 of the field facet mirror 19. This envelope 32 can also be understood as the numerical aperture of the intermediate focus 18a.

FIG. 5 shows schematically how in each case the field facet $25_i$ lying in the illumination channel $16_i$ images the intermediate focus 18a onto the associated pupil facet $29_i$ and how this pupil facet $29_i$ images the associated field facet $25_i$ onto the object field 5.

With the present distance FF1 between the intermediate focal plane 18 and the field facet mirror arrangement plane 33, the numerical aperture of the intermediate focus 18a is so large that a total of five field facets 25 lying next to one another in the xz-plane are illuminated with the illumination light 16. Accordingly, five illumination channels $16_i$ are then obtained from this illumination, that is, in addition to the illumination channel $16_i$ shown in FIG. 5, there are four further illumination channels which are assigned to the four further illuminated field facets 25 and the pupil facets 29 assigned thereto.

Figure 6:
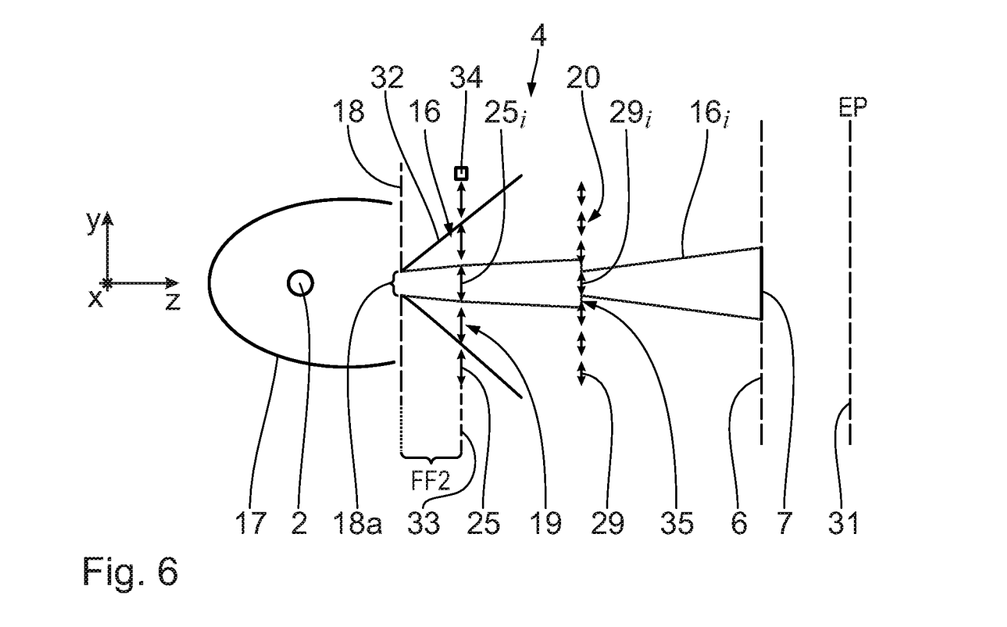
FIG. 6 shows the illumination optical unit according to FIG. 5 in a representation similar to FIG. 5 with a second, smaller distance between the intermediate focus and the field facet mirror.

FIG. 6 shows the illumination optical unit 4 according to FIG. 5, wherein the distance between the intermediate focal plane 18 and the field facet mirror arrangement plane 33 is decreased in the illumination optical unit 4 according to FIG. 6, with the result that a distance FF2 that is smaller compared to the distance FF1 according to FIG. 5 is obtained.

This distance displacement results from the actuation of a field facet mirror displacement actuator 34, which is shown schematically in FIGS. 5 and 6. As an alternative or in addition to a displacement of the field facet mirror 19, either a source module containing the light source 2 and the collector 17 and an intermediate focus stop can also be displaced in a positive z direction to the field facet mirror 19 or an illumination optical module containing the field facet mirror 19, the pupil facet mirror 20 can be displaced in the negative z direction toward the intermediate focus 18a.

Due to the smaller distance FF2 in the arrangement according to FIG. 6, now, rather than 5, the middle three field facets 25 of the field facet mirror 19 are still fully illuminated via the envelope 32 of the illumination light. The two outer field facets 25 are not impinged upon by the illumination light 16 in the arrangement according to FIG. 6 and therefore do not guide any illumination light toward the object field 5. Accordingly, in the arrangement according to FIG. 6 there are still three illumination channels $16_i$, of which again the middle illumination channel $16_i$ is shown. The change in distance to the distance FF2 leads to the fact that in each case one light source image is formed on the pupil facets $29_i$ assigned to the illumination channels $16_i$, which light source image overexposes the pupil facets $29_i$ at the peripheries, as is schematically shown in peripheral regions 35 of the pupil facet illumination of the illumination channel $16_i$ illustrated in FIG. 6. Since the light source 2 itself and correspondingly also its light source images has a lower illumination light intensity in the peripheral region, there is only a comparatively small loss of illumination light due to the overexposure of the pupil facets $29_i$.

In the arrangement according to FIG. 6, the illumination light is concentrated on fewer pupil facets $29_i$, wherein the ratio of the illuminated pupil facets compared to the arrangement according to FIG. 5 (ratio 3/5) is smaller than the ratio of the illumination light intensity guided over the illuminated pupil facets as compared to FIG. 5, which can be 90%, for example, with the result that only 10% of the illumination light is lost due to the overexposure in the peripheral regions 35 as compared to the arrangement according to FIG. 5.

Due to the more concentrated illumination of a smaller number of the pupil facets 29, a smaller degree of pupil filling can be realized with the arrangement according to FIG. 6. A spatial resolution of an illumination light illumination of the entrance pupil EP of the projection optical unit 10 in the entrance pupil plane 31 can then be improved. Images of the illuminated pupil facets $29_i$ in the entrance pupil plane 31 are also referred to as imaging spots.

As indicated in FIG. 5, the entrance pupil plane 31 can lie in the illumination light beam path downstream of the object field, that is to say in the beam path of the projection optical unit 10. Alternatively, it is possible for the entrance pupil plane 31 to lie in the illumination light beam path upstream of the object field 5 and in particular in the region of an arrangement plane of the pupil facet mirror 20. The spatial resolution of the illumination light illumination of the entrance pupil EP is attained in this case by way of the size of the illuminated pupil facets $29_i$ or by way of the size of the actual illumination spots on the illuminated pupil facets $29_i$.

Figure 7:
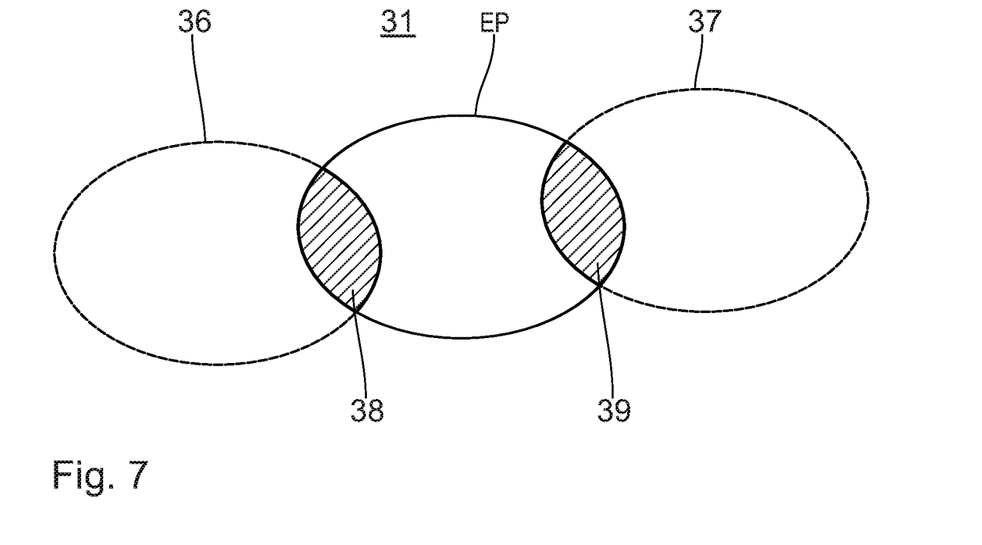
FIG. 7 schematically shows an entrance pupil of the imaging optical unit, wherein the radiation regions of the +/−first order of diffraction of the illumination light diffracted at object structures in the object field that overlap with the former are additionally shown.

The advantage of such an improved spatial resolution is illustrated with reference to FIGS. 7 and 8:

FIG. 7 shows an entrance pupil EP of the projection optical unit 10, which lies in the entrance pupil plane 31.

The object structures diffract the illumination light 16 in dependence on the type of the illuminated structures on the reticle 7. FIG. 7 schematically shows two such orders of diffraction, namely a −1 order of diffraction 36 and a +1 order of diffraction 37.

These orders of diffraction 36, 37 overlap with the entrance pupil EP in crescent-shaped overlap regions 38, 39. Only light that actually propagates through the entrance pupil 31 of the projection optical unit 10 into these overlap regions 38, 39 contributes to the imaging of the object structures. It is accordingly important to specify the illumination of the entrance pupil EP with the illumination optical unit 4 so that it is spatially resolved such that the overlap regions 38, 39 are well illuminated, wherein other regions of the entrance pupil EP can remain unilluminated.

Figure 8:
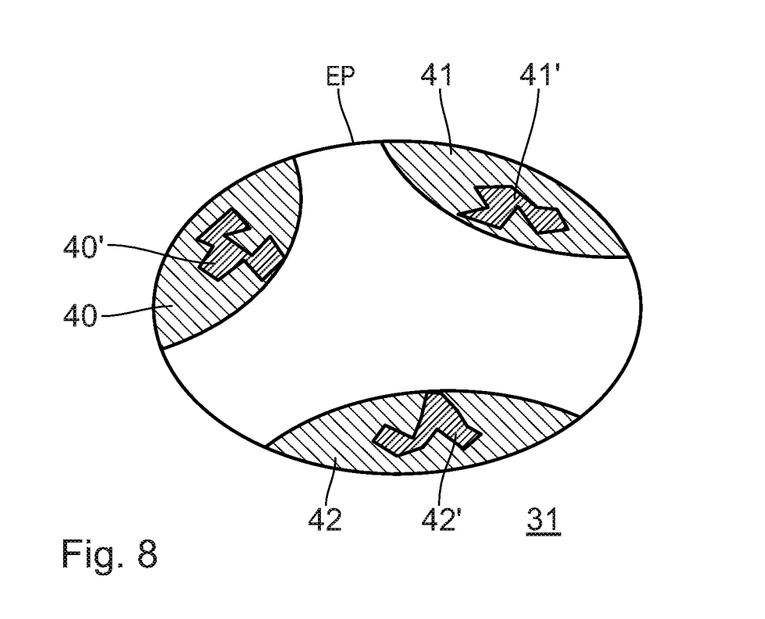
FIG. 8 shows, in a representation similar to FIG. 7, the entrance pupil with overlap regions that run differently due to other object structures with +/−first orders of diffraction of the illumination light, wherein regions of the pupil that are actually illuminated, that is to say filled, with the illumination light are shown schematically in these overlap regions.

FIG. 8 illustrates a spatial resolution of the pupil illumination. That figure schematically illustrates again the entrance pupil EP in the entrance pupil plane 31. In the illumination variant according to FIG. 8, three overlap regions 40, 41, 42 with the corresponding orders of diffraction of the diffraction at the object structures are obtained due to the corresponding threefold object structures on the reticle 7. FIG. 8 also shows peripheral contours 40', 41' and 42' of sections within the overlap regions 40, 41 and 42 that are in fact illuminated by the illumination light 16 in the entrance pupil EP. These illuminated sections can also be understood as the superposition of imaging spots of the various pupil facets 29 that contribute to the illumination. Correspondingly few and slightly expanded pupil facets 29, which are imaged into the entrance pupil 31 or, with the appropriate design of the projection optical unit 10, are already present in the entrance pupil, result in the illumination sections 40', 41', 42' being located completely within the overlap regions 40, 41 and 42. The degree of pupil filling of the entrance pupil EP with the illumination light 16 is therefore sufficiently small to ensure illumination of the entrance pupil EP that is adapted to the object structures on the reticle 7 for the optimized imaging thereof.

For the settable specification of the spatial resolution of the illumination light illumination of the entrance pupil EP, the distance $FF_i$ between the field facet mirror 19 and the intermediate focus 18a is selected depending on the size of the images of the pupil facets 29 within the entrance pupil EP and depending on the size of the overlap regions 40, 41, 42, which depends on the object structures, as explained above with reference to FIGS. 5 and 6.

The field facets $25_i$ of the field facet mirror 19 can be designed with an optical power that is specifiable in a settable manner. This can be used to adapt the imaging of the intermediate focus 18a onto the respective pupil facets $29_i$ to the respective distance $FF_i$ between the field facet mirror 19 and the intermediate focus 18a. For the settable optical power specification of the field facets $25_i$, these can be designed as adaptive optical units. For example, it is possible to specify a deflection of the respective field facet $25_i$ in a controlled manner using an individually assigned actuator. Alternatively or additionally, each of the field facets $25_i$ can be formed from a plurality of individual mirrors, which in turn are displaceable relative to one another and/or tiltable relative to one another via respective actuators for specifying different optical powers of the field facet $25_i$.

A variant for specifying different distances $FF_i$ between the field facet mirror 19 and the intermediate focus 18a is explained with reference to FIGS. 9 and 10. Components and functions corresponding to those which have already been explained above with reference to FIGS. 1 to 8, and particularly with reference to FIGS. 1, 5 and 6, bear the same reference signs and will not be discussed in detail again.

Figure 9:
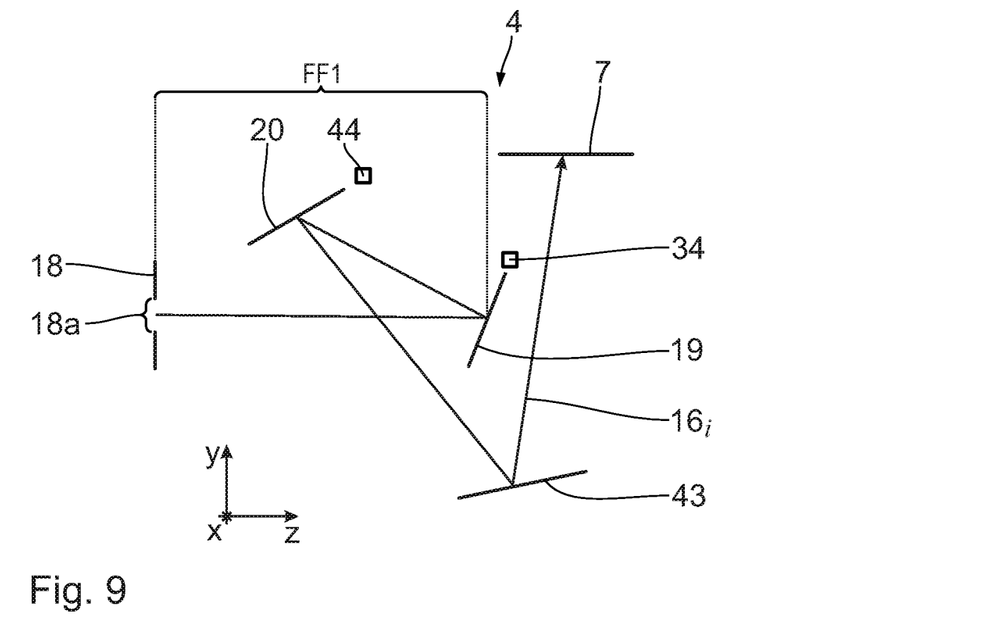
FIG. 9 schematically shows a further embodiment of the illumination optical unit in a meridional representation similar to FIG. 1, wherein a detail of the illumination beam path between the intermediate focus and the object field is shown.

In the case of the illumination optical unit 4 according to FIG. 9, the transfer optical unit 21 is formed by a single EUV condenser mirror 43. Only the course of an individual ray of an illumination light partial beam $16_i$ is shown schematically.

When the illumination-optical components are arranged between the intermediate focal plane 18 and the reticle 7, there is a first distance FF1 between the field facet mirror 19 and the intermediate focus 18a.

Figure 10:
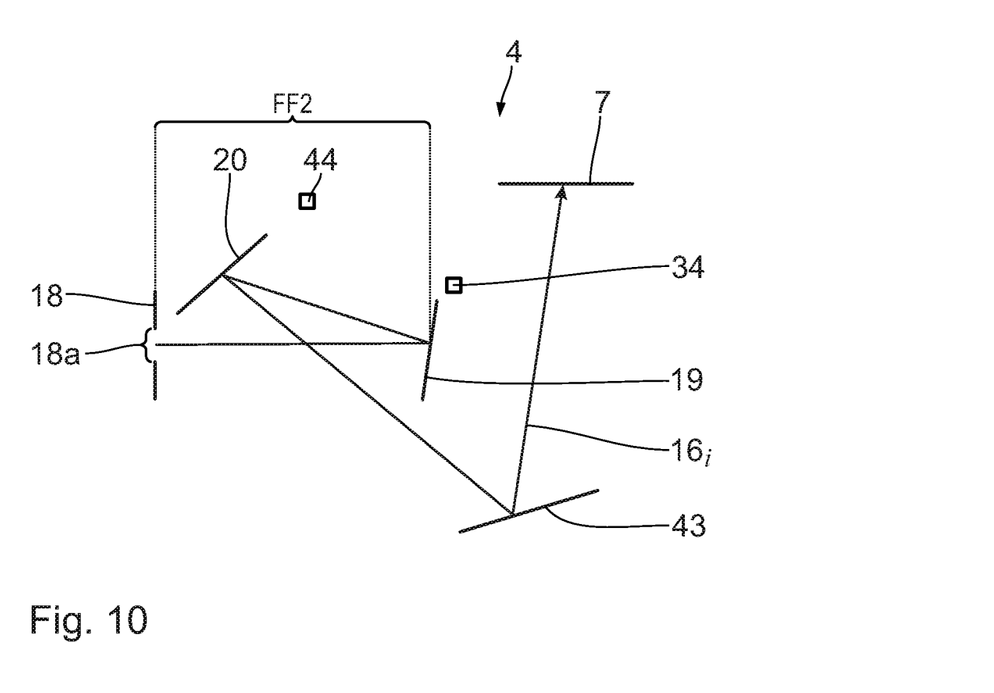
FIG. 10 shows, in a representation similar to FIG. 9, the illumination optical unit according to FIG. 9 with the field facet mirror that has been displaced and tilted compared to FIG. 9, with the pupil facet mirror displaced and tilted, and with a tilted condenser mirror for imaging the pupil facets of the pupil facet mirror into the entrance pupil.

FIG. 10 shows a modified arrangement of these components, in which there is now a smaller distance FF2 between the field facet mirror 19 and the intermediate focus 18a compared to the distance FF1 according to FIG. 9.

Compared to the arrangement of the illumination-optical components according to FIG. 9, the following changes have been made to the arrangement according to FIG. 10:
1. The distance between the field facet mirror 19 and the intermediate focus 18a is decreased by displacing the field facet mirror 19 in the negative z-direction from FF1 to FF2.
2. The field facet mirror 19 as a whole is tilted counter-clockwise in FIG. 10. The field facet mirror 19 is displaced and tilted via the field facet mirror actuator 34.
3. The pupil facet mirror 20 is displaced relative to the intermediate focal plane 18 in the negative z-direction and relative to the intermediate focus 18a also in the negative y-direction.
4. The pupil facet mirror 20 in FIG. 10 is tilted counter-clockwise in comparison with FIG. 9. A pupil facet mirror actuator 44 ensures the displacement and tilting of the pupil facet mirror 20.
5. The condenser mirror 43 in FIG. 10 is tilted counter-clockwise in comparison to FIG. 9.

The distance between the condenser mirror 43 and the reticle 7 can be identical in FIGS. 9 and 10. Furthermore, the distance between the pupil facet mirror 20 and the condenser mirror 43 can be identical in FIGS. 9 and 10.

The arrangement of the illumination-optical components between the intermediate focus 18a and the reticle 7 described in FIGS. 9 and 10 allows the distance $FF_i$ to be specified in a settable manner between a smallest and a greatest distance without the need for a displacement of the reticle 7 relative to the intermediate focus 18a. A displacement of the field facet mirror 19 relative to the intermediate focus 18a thus does not lead to a change in the light path along the illumination channels $16_i$ between the intermediate focus 18a and the object field 5.

A further embodiment of a design of the illumination optical unit 4 for the settable specification of a spatial resolution of the illumination of the entrance pupil of the projection optical unit 10 is explained below with reference to FIGS. 11 and 12. Components and functions corresponding to those which have already been explained above with reference to FIGS. 1 to 10, and particularly with reference to FIGS. 1, 5, 6, 9 and 10, bear the same reference signs and will not be discussed in detail again.

Figure 11:
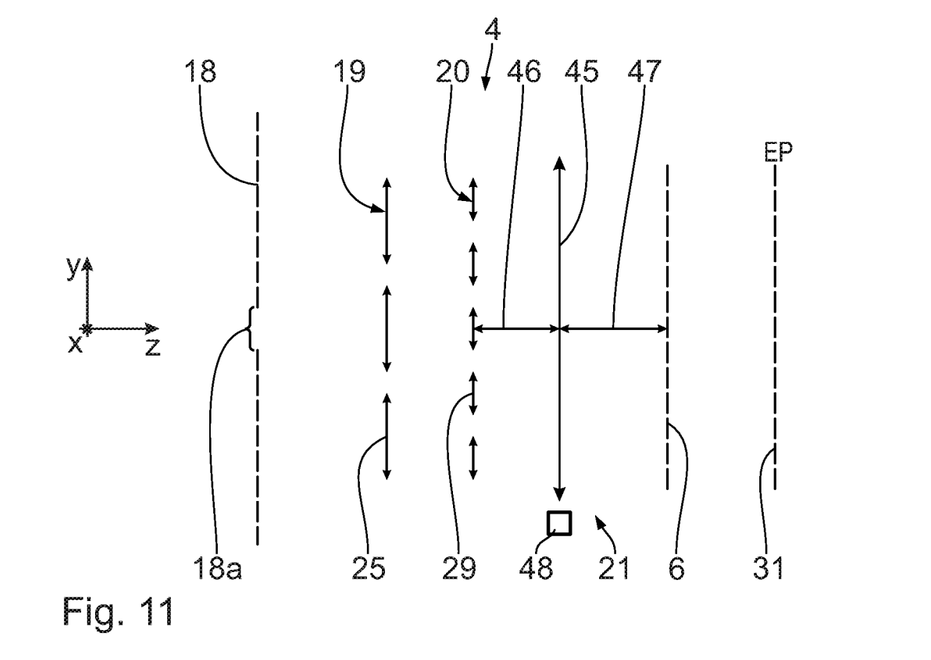
FIG. 11 shows components of a further embodiment of the illumination optical unit between the intermediate focus and the entrance pupil in a representation that is likewise transmissive in an illustrative manner and is similar to FIGS. 5 and 6, wherein a condenser mirror for imaging the pupil facets into the entrance pupil is arranged between the field facet mirror and the object field, with the position of the condenser mirror between the pupil facet mirror and the reticle and also its optical power being specifiable in a settable manner.

In the embodiment according to FIG. 11, the transfer optical unit 21, which in turn is designed as a condenser mirror 45, is designed for the settable specification of an imaging scale of the imaging of the pupil facet 29 onto the entrance pupil EP in the entrance pupil plane 31 of the projection optical unit 10. For this purpose, the condenser mirror 21 is displaceable along the z-direction, as indicated by double arrows 46, 47 in FIG. 11. Alternatively or additionally, an optical power of the condenser mirror 45 can be specified in a settable manner. This displacement of the condenser mirror 45 or the settable specification of the optical power takes place via one or more condenser mirror actuators 48, of which exactly one condenser mirror actuator 48 is shown in FIG. 11. The condenser mirror 45 can be designed as an adaptive mirror, as already explained above in connection with the field facets 25 of the embodiment from FIGS. 5 and 6.

On the basis of the settable specification of the imaging scale of the imaging of the pupil facets 29 into the entrance pupil in the entrance pupil plane 31, the spatial resolution of the illumination light illumination of the entrance pupil in the entrance pupil plane 31 can in turn be adapted to specify the pupil filling degree.

This specification of the imaging scale takes place with the relative position of the pupil facet mirror 20 relative to the object field 5 staying the same.

Figure 12:
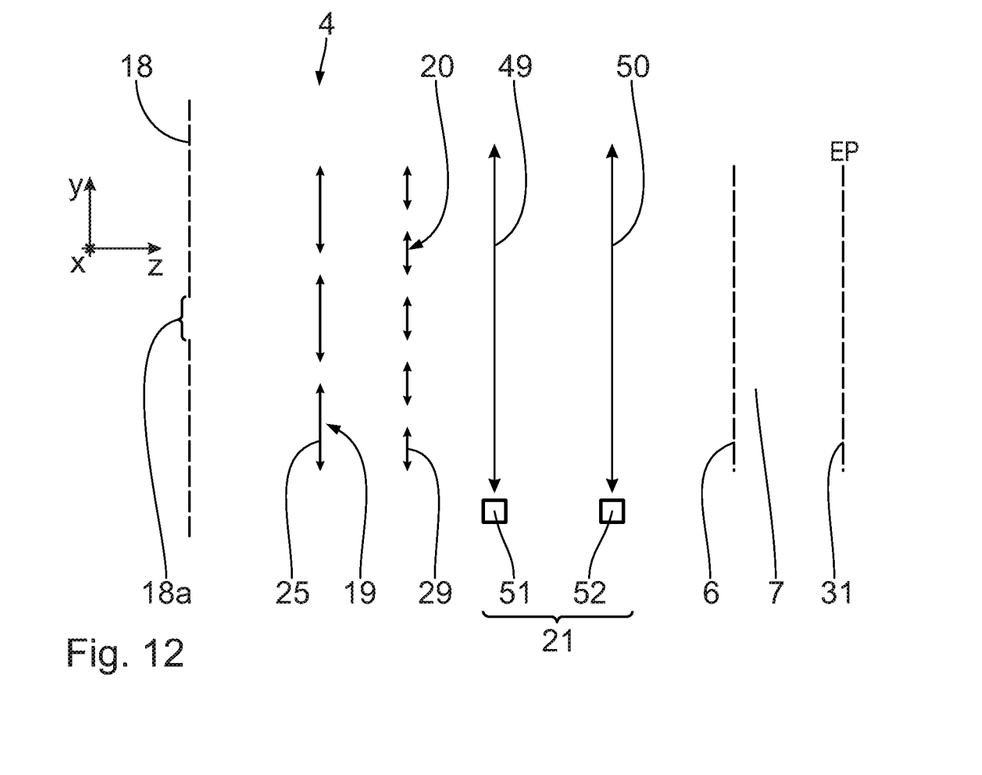
FIG. 12 shows, in a representation similar to FIG. 11, a further embodiment of the illumination optical unit with a telescope arrangement with two telescope mirrors instead of the condenser mirror of the illumination optical unit according to FIG. 11.

FIG. 12 shows an alternative configuration of the transfer optical unit 21 for the settable specification of an imaging scale of the imaging of the pupil facets 29 onto the entrance pupil in the entrance pupil plane 31. The transfer optical unit 21 includes two telescopic mirrors 49, 50 in this case. These telescopic mirrors 49, 50 are displaceable and/or tiltable via mirror actuators 51, 52, in particular along the z direction, in order to specify the imaging scale.

Using FIGS. 13 to 15, a further embodiment of an illumination optical unit for the settable specification of a spatial resolution of an illumination of the entrance pupil of the projection optical unit 10 within a variant of the illumination optical unit 4 will be described below, which can be used as an alternative or in addition to the explanations explained above. Components and functions corresponding to those which have already been explained above with reference to FIGS. 1 to 12, and particularly with reference to FIG. 4, bear the same reference signs and will not be discussed in detail again.

The pupil facets 29 are designed such that they are displaceable perpendicularly to a normal N on a respective reflection surface 53 of the pupil facets 29 so that a spatial resolution of the illumination of the entrance pupil EP can be specified in a settable manner. Actuators 54 individually assigned to the pupil facets 29 can be used to specify this displacement.

Figure 13:
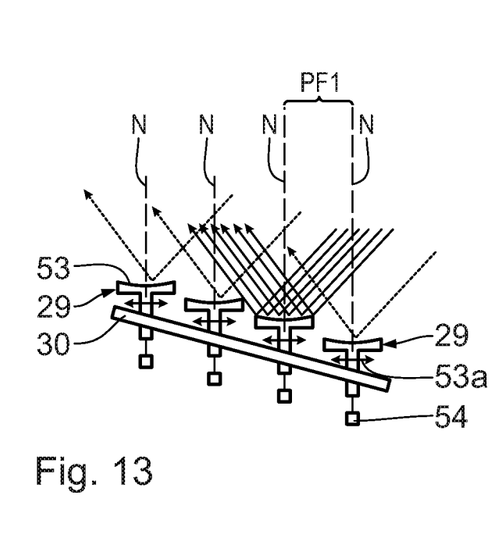
FIG. 13 shows a detail of a carrier of an embodiment of the pupil facet mirror, which carries a total of four pupil facets, wherein the pupil facet mirrors are located at a first distance from one another perpendicular to a normal on reflection faces of the pupil facets.

This displaceability is illustrated in FIG. 13 by way of double-headed arrows 53a.

Figure 14:
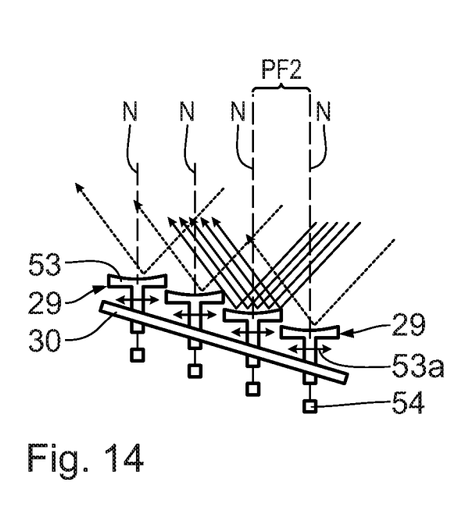
FIG. 14 shows the detail according to FIG. 13, wherein the pupil facets have been displaced on the carrier in such a way that their distance perpendicular to the normal on the reflection faces of the pupil facets is reduced in comparison to FIG. 13.
Figure 15:
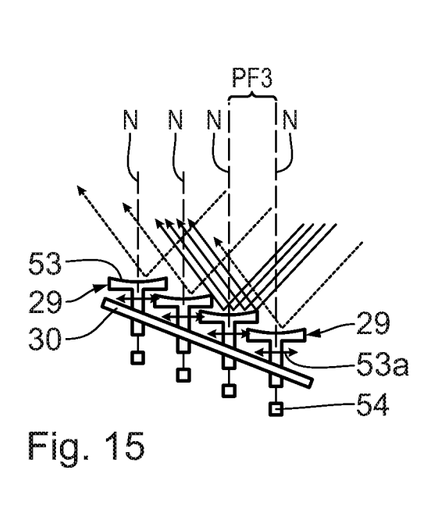
FIG. 15 shows the detail according to FIG. 13, wherein the pupil facets have been displaced on the carrier in such a way that their distance perpendicular to the normal on the reflection faces of the pupil facets is reduced even further compared to FIG. 14.

FIGS. 14 and 15 show arrangement variants of the pupil facet 29 according to FIG. 13, wherein a distance PFi between adjacent pupil facets 29 in the arrangement according to FIG. 13 has the greatest distance PF1, in the arrangement according to FIG. 14 a smaller distance PF2, and in the arrangement according to FIG. 15 has a smallest distance PF3. With a decrease in the distance PFi, the spatial resolution of the illumination of the entrance pupil EP in the entrance pupil plane 31 improves, since with a decreasing distance PFi an illuminated region on the pupil facets 29 becomes smaller and smaller due to shadowing effects. The images of the illuminated regions of the pupil facets 29 in the entrance pupil EP are then correspondingly smaller, which leads to a correspondingly higher spatial resolution.

During the projection exposure, at least one part of the reticle 7 in the object field 5 is imaged, with the aid of the projection exposure apparatus 1, onto a region of a light-sensitive layer on the wafer 13 in the image field 11 for the lithographic production of a microstructured or nanostructured component, in particular of a semiconductor component, for example a microchip. Here, a check is initially performed as to which object structures are to be imaged on the reticle 7. Depending on this, the spatial resolution of the illumination light illumination of the entrance pupil EP of the projection optical unit 10 is specified with the aid of at least one of the illumination optical unit variants described above. The reticle 7 and the wafer 13 are then moved synchronously in time in the y-direction continually in the scanning operation for the projection exposure.

What is claimed is:

1. An illumination optical unit configured to illuminate structures of an object in an object field with illumination light from a light source along an illumination beam path, the illumination optical unit comprising:
   a field facet mirror comprising a plurality of field facets; and
   a pupil facet mirror comprising a plurality of pupil facets, wherein:
      the field facets and the pupil facets are configured so that in each case a partial beam of the illumination light is guided over exactly one field facet and exactly one pupil facet along an illumination channel from the light source to the object field;
      the field facet mirror is a component of a field facet transfer optical unit configured to image a light source image along in each case one illumination channel onto one of the pupil facets;
      the pupil facet mirror is a component of a pupil facet transfer optical unit configured to superimposedly image the field facets into the object field; and
      the illumination optical unit is configured to set, based on the structures of the object in the object field, a spatial resolution of an illumination light illumination of an entrance pupil of a projection optical unit arranged downstream of the object field in the illumination light beam path to image the structures of the object in the object field into an image field.

2. The illumination optical unit of claim 1, wherein the field facet mirror is displaceable relative to the light source image to set a distance between the field facets and the light source image.

3. The illumination optical unit of claim 1, wherein the field facets of the field facet mirror have a settable an optical power.

4. The illumination optical unit of claim 2, wherein the illumination optical unit is configured so that a displacement of the field facet mirror relative to the light source image to set the distance between the field facets and the light source image does not lead to a change in the light path along the illumination channels between the light source image and the object field.

5. The illumination optical unit of claim 1, wherein:
   the field facet mirror is tiltable over-all;
   the pupil facet mirror is tiltable over-all;
   the pupil facet mirror is displaceable relative to the light source image to set the distance between the field facets and the pupil facets; and
   at least one additional mirror is present in the illumination light beam path of the illumination optical unit between the light source image and the object field.

6. The illumination optical unit of claim 1, further comprising an entrance pupil transfer optical unit downstream of the pupil facet mirror in the illumination light beam path, wherein:
   the entrance pupil transfer optical unit is configured to image the pupil facets into an entrance pupil of a downstream projection optical unit configured to image the object field into an image field; and
   the entrance pupil transfer optical unit is configured to set an imaging scale of the imaging of the pupil facets onto the entrance pupil with a position of the pupil facet mirror relative to the object field staying the same.

7. The illumination optical unit of claim 6, wherein the entrance pupil transfer optical unit comprises a mirror that is displaceable relative to the pupil facet mirror to set the imaging scale of the imaging of the pupil facets onto the entrance pupil.

8. The illumination optical unit of claim 7, wherein a mirror of the entrance pupil transfer optical unit has a settable optical power.

9. The illumination optical unit of claim 6, wherein a mirror of the entrance pupil transfer optical unit has a settable optical power.

10. The illumination optical unit of claim 1, wherein the pupil facet mirror is configured to set a pupil facet distance of adjacent pupil facets perpendicular to a normal on a reflection surface of the pupil facets.

11. The illumination optical unit of claim 10, wherein the pupil facets along the pupil facet distance are displaceable relative to one another on a pupil facet carrier of the pupil facet mirror.

12. The illumination optical unit of claim 1, wherein:
   the field facet mirror is displaceable relative to the light source image to set a distance between the field facets and the light source image; and
   the field facets of the field facet mirror have a settable an optical power.

13. The illumination optical unit of claim 12, wherein the illumination optical unit is configured so that a displacement of the field facet mirror relative to the light source image to set the distance between the field facets and the light source image does not lead to a change in the light path along the illumination channels between the light source image and the object field.

14. The illumination optical unit of claim 1, wherein:
   the field facets of the field facet mirror have a settable an optical power;
   the field facet mirror is tiltable over-all;
   the pupil facet mirror is tiltable over-all;
   the pupil facet mirror is displaceable relative to the light source image to set the distance between the field facets and the pupil facets; and
   at least one additional mirror is present in the illumination light beam path of the illumination optical unit between the light source image and the object field.

15. The illumination optical unit of claim 1, further comprising an entrance pupil transfer optical unit downstream of the pupil facet mirror in the illumination light beam path,
   wherein:
      the entrance pupil transfer optical unit is configured to image the pupil facets into an entrance pupil of a downstream projection optical unit configured to image the object field into an image field;
      the entrance pupil transfer optical unit is configured to set an imaging scale of the imaging of the pupil facets onto the entrance pupil with a position of the pupil facet mirror relative to the object field staying the same; and
      field facets of the field facet mirror have a settable an optical power.

16. An illumination system, comprising:
   an illumination optical unit according to claim 1; and
   a light source configured to produce the illumination light.

17. An optical system, comprising:
   an illumination optical unit according to claim 1; and a projection optical unit configured to image the object field into an image field.

18. An apparatus comprising:

an illumination optical unit according to claim 1;

a projection optical unit configured to image the object field into an image field; and a light source configured to produce the illumination light, wherein the apparatus is a projection exposure apparatus.

19. The apparatus of claim 18, further comprising:

an object holder comprising an object displacement drive to displace the object along an object displacement direction; and a wafer holder comprising a wafer displacement drive to displace a wafer in a manner synchronized with the object displacement drive.

20. A method of using a projection exposure apparatus comprising an illumination optical unit and a projection optical unit, the method comprising:

determining structures of a lithography mask in an object field of the projection optical unit;

based on the determined structures of the lithography mask, setting a spatial resolution of an illumination light illumination of an entrance pupil of the of the projection optical unit, the entrance pupil of the of the projection unit being downstream of the object field;

using the illumination optical unit to illuminate the structures of the lithography mask with illumination light such that the entrance pupil of the projection optical unit is illuminated with the set spatial resolution of the illumination light; and using the projection optical unit to project the structures of the lithography mask onto a region of a light-sensitive layer.

* * * * *

UNITED STATES PATENT AND TRADEMARK OFFICE
CERTIFICATE OF CORRECTION

PATENT NO. : 10,928,733 B2
APPLICATION NO. : 16/934652
DATED : February 23, 2021
INVENTOR(S) : Michael Patra Page 1 of 1

It is certified that error appears in the above-identified patent and that said Letters Patent is hereby corrected as shown below:

In the Claims

Column 16, Line 5, Claim 20, delete "of the of the" and insert -- of the --;

Column 16, Line 6, Claim 20, delete "of the of the" and insert -- of the --.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*